United States Patent
Kim et al.

(10) Patent No.: US 9,343,635 B2
(45) Date of Patent: May 17, 2016

(54) LIGHT CONVERSION LIGHT-EMITTING DEVICE WITH ENHANCED LUMINESCENCE EFFICIENCY USING ANISOTROPIC METAL NANOPARTICLES

(71) Applicant: SAMSUNG TOTAL PETROCHEMICALS CO., LTD., Seosan-si (KR)

(72) Inventors: Ki Se Kim, Seosan-si (KR); Do Hoon Lee, Seosan-si (KR); Ho Sik Chang, Daejeon (KR); Chang Hyun Choi, Seoul (KR)

(73) Assignee: HANWHA TOTAL PETROCHEMICAL CO., LTD., Seosan-Si (KR)

( * ) Notice: Subject to any disclaimer, the term of this patent is extended or adjusted under 35 U.S.C. 154(b) by 0 days.

(21) Appl. No.: 14/409,942

(22) PCT Filed: Nov. 7, 2013

(86) PCT No.: PCT/KR2013/010051
§ 371 (c)(1),
(2) Date: Dec. 19, 2014

(87) PCT Pub. No.: WO2014/189188
PCT Pub. Date: Nov. 27, 2014

(65) Prior Publication Data
US 2015/0155449 A1 Jun. 4, 2015

(30) Foreign Application Priority Data
May 23, 2013 (KR) .......................... 10-2013-0058451

(51) Int. Cl.
*H01L 33/50* (2010.01)
*B82B 1/00* (2006.01)
(Continued)

(52) U.S. Cl.
CPC ................ *H01L 33/502* (2013.01); *B82B 1/00* (2013.01); *H01L 33/50* (2013.01); *H01L 33/505* (2013.01); *H01L 51/5262* (2013.01); *H01L 33/04* (2013.01); *H01L 2933/0083* (2013.01)

(58) Field of Classification Search
USPC .......................................................... 257/13
See application file for complete search history.

(56) References Cited

U.S. PATENT DOCUMENTS

| | | | |
|---|---|---|---|
| 8,314,439 B2 | 11/2012 | Tan et al. | |
| 2003/0029274 A1* | 2/2003 | Natan .................. | B01J 13/0043 75/741 |

(Continued)

FOREIGN PATENT DOCUMENTS

| | | |
|---|---|---|
| KR | 10-0659900 | 12/2006 |
| KR | 10-2009-0105114 | 10/2009 |

(Continued)

OTHER PUBLICATIONS

Giannini et al., "Plasmonic Nanoatennas: Fundamentals and Their Use in Controlling the Radiative Properties of Nanoemitters," Chemical Review, 2011, 25 pages.

(Continued)

*Primary Examiner* — Thao P Le
(74) *Attorney, Agent, or Firm* — Harness, Dickey & Pierce, P.L.C.

(57) ABSTRACT

There is provided a light-emitting device with enhanced luminescence efficiency, which simultaneously exhibits excitation enhancement and emission enhancement of a light-emitting material by controlling two or multiple surface plasmon resonance bands of anisotropic metal nanoparticles to be formed in a near ultraviolet light range and a visible light range and optimizing overlapping of a wavelength of a near ultraviolet or blue light source with an absorption wavelength and an emission wavelength of the light-emitting material. There is also provided a light-emitting device with improved color gamut and luminance, which simultaneously exhibit emission enhancement of different types of light-emitting materials by controlling two or multiple surfaces plasmon resonance bands of anisotropic metal nanoparticles to be overlapped with absorption and emission wavelengths of two or more light-emitting materials having different emission wavelengths from one another.

6 Claims, 3 Drawing Sheets

(51) Int. Cl.
*H01L 51/52* (2006.01)
*H01L 33/04* (2010.01)

(56) References Cited

U.S. PATENT DOCUMENTS

2010/0261263 A1* 10/2010 Vo-Dinh ............... B82Y 30/00
                                                          435/287.1
2011/0220814 A1*  9/2011 Rudenja ............... G02B 5/008
                                                          250/493.1
2012/0237605 A1*  9/2012 Messersmith ........ A61K 9/0092
                                                          424/491

FOREIGN PATENT DOCUMENTS

| KR | 10-0966373       | 6/2010  |
| KR | 10-2010-0137284  | 12/2010 |
| KR | 10-1062789       | 8/2011  |
| KR | 10-2011-0118956  | 11/2011 |

OTHER PUBLICATIONS

Schuller et al., "Plasmonics for extreme light concentration and manipulation," Nature Materials, vol. 9, Mar. 2010, 13 pages.

Lakowicz et al., "Plasmon-controlled fluorescence: a new paradigm in fluorescence spectroscopy," The Analyst, 2008, 39 pages.

Chen et al., "Dependence of Fluorescence Intensity on the Spectral Overlap between Fluorophores and Plasmon Resonant Single Silver Nanoparticles," Nano Letters, vol. 7, No. 3, 2007, 7 pages.

Chen et al., "Excitation enhancement of CdSe quantum dots by single metal nanoparticles," Applied Physics Letters 93, 2008, 3 pages.

* cited by examiner

LIGHT CONVERSION LIGHT-EMITTING DEVICE WITH ENHANCED LUMINESCENCE EFFICIENCY USING ANISOTROPIC METAL NANOPARTICLES

TECHNICAL FIELD OF THE INVENTION

The present invention relates to a light conversion light-emitting device with enhanced luminescence efficiency using anisotropic metal nanoparticles having an aspect ratio, and more particularly, to a light conversion light-emitting device with a maximized luminescence efficiency by controlling two or multiple surface plasmon resonance bands formed by anisotropic metal nanoparticles, optimizing overlapping of a wavelength of a near ultraviolet or blue light source with an absorption wavelength and an emission wavelength of a light-emitting material, and thus simultaneously exhibiting an excitation enhancement and emission enhancement of a light-emitting material.

BACKGROUND OF THE INVENTION

A light-emitting diode (LED) that has newly attracted attention as a next-generation light source has merits such as high luminescence efficiency, high responsiveness, long lifespan, and miniaturization compared to an existing incandescent lamp, halogen lamp, and fluorescent lamp, and also has excellent characteristics as an environment-friendly light source that does not use mercury unlike the fluorescent lamp. Accordingly, the light-emitting diode has been widely used in a very wide industry field of signals, signs, displays, communications, mobile terminals, vehicles, and general illuminations. Especially, a white light-emitting diode based on such a light-emitting diode has been used for a back light unit (BLU) in LCD TV or a notebook computer, and a head lamp of a vehicle, and has been expected to continue high speed growth in an illumination market due to a cost reduction of the general illumination and an execution of a regulation policy for the incandescent lamp.

As a general method of realizing a white light-emitting diode, there are a method of using a combination of light-emitting diode chips that emit light rays with different monochrome wavelengths, and a method of using a combination of a light-emitting diode chip and a light-emitting material having a single component or multiple components. When the white light-emitting diode is realized by the combination of the plurality of light-emitting diode chips, since outputs of the chips are changed due to non-uniform in operation voltages applied to the chips and an ambient temperature, it is difficult to realize white light with high color reproducibility and high color purity. Accordingly, there has been generally used a method of manufacturing a white light-emitting diode by applying a light-emitting material and a sealing member made of a polymer material on a light-emitting diode chip having a monochrome wavelength of near ultraviolet light or blue light. In order to realize white light with high purity, a combination of the light-emitting diode chip and a single light-emitting material or a plurality of light-emitting materials having an emission wavelength of red, green, blue and yellow is used. That is, the light-emitting material in the white light-emitting diode serves to realize white and emission color of the light-emitting diode chip which is not absorbed by the light-emitting material by absorbing blue light (or near ultraviolet light) generated from the light-emitting diode chip, and converting the absorbed blue light into red, green, blue, or yellow light with a unique long wavelength of the light-emitting material.

The entire luminescence efficiency of a white light-emitting diode is a very important factor representing performance of the light-emitting diode, and in order to realize a white light-emitting diode having high luminance at a low power, it is necessary to increase light conversion efficiency of a light-emitting material. Furthermore, two or more types of light-emitting materials are needed to realize white light having high color purity. That is, an absorption wavelength of the light-emitting material needs to be appropriately overlapped with an emission wavelength of the light-emitting diode chip, and an emission wavelength thereof needs to be formed in a visible light range of a longer wavelength in order to realize white light. Moreover, the light-emitting material having high internal quantum yield is preferably used. Unfortunately, the absorption and emission characteristics of such light-emitting material are unique characteristics determined in a step of synthesizing or manufacturing the light-emitting material, and there are considerable limitations in controlling the absorption and emission wavelengths and manufacturing the light-emitting material having high quantum yield.

In order to solve these limitations, localized surface plasmon resonance (LSPR) of metal nanoparticles may be used. The localized surface plasmon resonance means a strong interaction between metal nanoparticles and light. When light (hv) is incident onto metal nanoparticles or nanostructures, surface free electrons of the metal nanoparticles are allowed to collectively oscillate along an electric field of the incident light to form a surface plasmon, and a very strong local electric field is formed around the metal nanoparticles. In this case, when the light-emitting material is located adjacent to the metal nanoparticles, since light absorption is increased due to the strong electric field locally formed around the metal nanoparticles, excitation enhancement ($E_{ex}$) can be exhibited. As a result, an increase in luminous intensity of the light-emitting material can be expected. In addition, an emission enhancement ($E_{em}$) causing an increase in the unique quantum yield of the light-emitting material due to a mutual attraction between the excited light-emitting material and the surface plasmon can be expected. In this case, when the quantum yield is represented by a radiative decay rate ($\gamma_{rad}$) and a non-radiative decay rate ($\gamma_{non\text{-}rad}$) in Equation 1, for a fluorescence material located around the metal nanoparticles, since the entire radiative decay rate ($\gamma_{rad}+\gamma_{M\text{-}rad}$) becomes considerably higher than the non-radiative decay rate ($\gamma_{rad}+\gamma_{M\text{-}rad} \gg \gamma_{non\text{-}rad}$) due to a metal-induced radiative decay rate ($\gamma_{M\text{-}rad}$) induced by the surface plasmon of the metal nanoparticles, the quantum yield is increased (see Chemical Reviews, 2011, 111, 3888; Nature Materials, 2010, 9, 193; Analyst, 2008, 133, 1308).

$$Q = \frac{\gamma_{rad}}{\gamma_{rad}+\gamma_{non\text{-}rad}}, \quad \text{[Equation 1]}$$

$$Q_{Metal} = \frac{\gamma_{rad}+\gamma_{M\text{-}rad}}{\gamma_{rad}+\gamma_{M\text{-}rad}+\gamma_{non\text{-}rad}}$$

That is, the total emission enhancement ($E_{total}$) of the light-emitting material due to the surface plasmon of the metal nanoparticles is the product of the excitation enhancement $E_{ex}$ and the emission enhancement ($E_{em}$), and may be expressed as Equation 2 below.

$$E_{total}=E_{ex} \times E_{em} \quad \text{[Equation 2]}$$

Accordingly, in order to maximize luminous intensity enhancement of the light-emitting material due to the surface plasmon of the metal nanoparticles, it is important to simultaneously exhibit the excitation enhancement ($E_{ex}$) and the emission enhancement ($E_{em}$). In order to control the excitation and emission enhancements, it is important to allow the absorption and emission wavelengths of the light-emitting material to be effectively overlapped with the surface plasmon bands of the metal nanoparticles (see Nano Letters, 2007, 7, 690; Applied Physics Letters, 2008, 93, 53106). For example, when the absorption wavelength of the light-emitting material is overlapped with the plasmon band, since the light absorption is increased, the excitation enhancement ($E_{ex}$) of the light-emitting material can be expected. Meanwhile, when the emission wavelength of the light-emitting material is overlapped with the plasmon band, since the radiative decay rate is increased due to coupling of the excited light-emitting material and the surface plasmon, the emission enhancement ($E_{em}$) causing an increase in the quantum yield can be expected. Therefore, when the absorption and emission spectra of the light-emitting material are allowed to be appropriately overlapped with the surface plasmon bands of the metal nanoparticles, since the excitation enhancement and the emission enhancement of the light-emitting material can be simultaneously exhibited, it is possible to maximize the luminous intensity enhancement.

In recent years, there has reported a technology of realizing a light-emitting diode with an increased light conversion efficiency and a high luminance at low power by exhibiting the excitation enhancement and the emission enhancement of the light-emitting material in a light-emitting diode that realizes white light by combination of a light-emitting material and a light-emitting diode chip having a wavelength of near ultraviolet light or blue light by using a principle of the luminous intensity enhancement due to the surface plasmon of the metal nanoparticles (Korean Patent Registration Nos. 10-0659900, 10-0966373 and 10-1062789).

Disadvantageously, in the aforementioned patent documents, metal nanoparticles which are synthesized in a solution process by a bottom-up method or nanostructures having a single surface plasmon band, which are arranged on a substrate by etching a metal thin film by a top-down method, are typically used. In this case, there are considerable limitations in maximizing the luminous intensity enhancement by simultaneously exhibiting the excitation enhancement and the emission enhancement of the light-emitting material. For example, in the white light-emitting diode using a light-emitting diode chip having near ultraviolet or blue light wavelength and a yellow light-emitting material such as yttrium aluminum garnet (YAG), when spherical silver nanoparticles are used, since a surface plasmon band is generally formed around a wavelength of 400 nm to 500 nm in the spherical silver nanoparticles, the near ultraviolet or blue light wavelength of the light-emitting diode chip and an absorption wavelength of the yellow light-emitting material are effectively overlapped with each other, and thus, since absorption of the yellow light-emitting material is increased, it is possible to expect excitation enhancement efficiency. However, since an emission wavelength of the yellow light-emitting material and the surface plasmon band of the silver nanoparticles are not effectively overlapped with each other, it is difficult to expect the emission enhancement causing an increase in the internal quantum yield. Thus, it is difficult to maximize the luminous intensity enhancement.

Meanwhile, in the configuration of the same white light-emitting diode, when gold nanoparticles are used, since the surface plasmon band is formed in a wavelength of 500 nm to 600 nm, the emission wavelength of the yellow light-emitting material and the surface plasmon band of the gold nanoparticles can be effectively overlapped with each other. Thus, an emission enhancement causing an increase in internal quantum yield can be exhibited. However, since the surface plasmon band of the gold nanoparticles is not overlapped with the near ultraviolet light or blue light wavelength of the light-emitting diode chip, it is difficult to expect excitation enhancement due to an absorption increase of the light-emitting material.

When plurality (for example, two or more) types of light-emitting materials having different emission wavelengths such as blue, green, red and yellow are introduced to realize white light with high color purity, if the metal nanoparticles or nanostructures that form a single surface plasmon band are used, it is difficult to simultaneously exhibit emission enhancements of different types of light-emitting materials. For this reason, there are considerable limitations in realizing the light conversion light-emitting device with high luminance and high color purity.

SUMMARY OF THE INVENTION

The present invention has been made in an effort to provide a light conversion light-emitting device with enhanced luminescence efficiency, which simultaneously exhibits an emission enhancement and excitation enhancement of a light-emitting material by controlling two or multiple surface plasmon resonance bands formed by anisotropic metal nanoparticles to optimize overlapping of a wavelength of a near ultraviolet or blue light source with an absorption wavelength and an emission wavelength of a light-emitting material, and thus.

The present invention has been made in an effort to also provide a light conversion light-emitting device simultaneously exhibiting emission enhancements of a plurality of light-emitting materials by controlling two or multiple surface plasmon bands of anisotropic metal nanoparticles to optimize overlapping with absorption wavelengths and emission wavelengths of two or more types of light-emitting materials having different emission wavelengths.

DESCRIPTION OF THE INVENTION

According to an aspect of the present invention, there is provided a light conversion light-emitting device with high luminance at a low power by maximizing a luminous intensity enhancement by forming an emissive layer of the light-emitting device using a light-emitting material comprising anisotropic metal nanoparticles or nanostructures capable of forming two or multiple surface plasmon bands to simultaneously realize excitation enhancement and emission enhancement of the light-emitting material.

The anisotropic metal nanoparticles or nanostructures used in the present invention refer to nano-sized particles having an aspect ratio of a transverse axis to a longitudinal axis. Particularly, the nanostructures refer to nano-sized structures formed by etching a metal thin film. As the anisotropic metal nanoparticles, metal such as Ag, Au, Al, Cu, Li, Pd, Pt and the like, or an alloy thereof may be used. In the light-emitting device of the present invention, as the metal used as a raw material of the anisotropic metal nanoparticles, the kind of the metal may be selected in consideration of a spectrum overlap, and the kind of the metal is selected depending on a position of the emission wavelength of the light-emitting device and positions of the absorption and emission wavelengths of the light-emitting material to adjust the aspect ratio.

For example, in order to enhance a luminous intensity of the light-emitting material having absorption and emission wavelengths in a ultraviolet light range, it is desirable to use Al nanoparticles having plasmon bands in the ultraviolet light range or an alloy of Al and another metal. Meanwhile, in order to enhance the luminous intensity of the light-emitting material having the absorption and emission wavelengths in the visible light range, it is desirable to use Ag or Au nanoparticles having surface plasmon bands in the visible light range, or an alloy of Au and Ag or another metal.

As a method of manufacturing the anisotropic metal nanoparticles or nanostructures, there are a bottom-up method of synthesizing nanoparticles by processing a metal precursor in a solution process by using a reducing agent and a surfactant, and a top-down method of manufacturing nanostructures by etching a metal thin film through an electron beam lithography technique. The bottom-up method is preferably used in consideration of manufacturing cost. A method of synthesizing a nanorod by manufacturing a metal seed and growing the metal seed in the form of an anisotropic rod is applied to prepare the anisotropic metal nanoparticles. In this method, the aspect ratio of the nanorod may be controlled by adjusting factors such as a size of the seed, a relative ratio of the seed to the metal precursor and temperature and pH of a solution during the synthesizing of the nanorod, or by re-growing the nanorod by etching the nanorod or adding the metal precursor after the synthesizing. Technologies of synthesizing the anisotropic nanoparticles and controlling the aspect ratio thereof are already known, and thus, specific synthesizing procedures thereof will be omitted.

In the present invention, the light-emitting material refers to an organic or inorganic material comprising a semiconductor quantum dot capable of exhibiting fluorescence or phosphorescence distinguished by an emission mechanism, and the kind of the light-emitting material is not particularly limited. In order to realize white light with high color purity, a single light-emitting material or a plurality of light-emitting materials may be used.

In the present invention, the light-emitting material is preferably formed by a combination of a semiconductor light-emitting diode having an emission wavelength of near ultraviolet light or blue light and a light-emitting material having an emission wavelength longer than the light-emitting diode.

In the present invention, a nitride semiconductor that emits near ultraviolet light or blue light may be used as the light-emitting device, and various light-emitting devices that emit red light and green light may be used. As a specific example, the light conversion light-emitting device of the present invention preferably includes a combination of a light source having an emission wavelength of near ultraviolet light or blue light and a light-emitting material having an emission wavelength longer than that of the light source.

In the light conversion light-emitting device of the present invention, in order to allow the emission wavelength of the light source of the light-emitting device, the absorption and emission wavelengths of the light-emitting material and the surface plasmon bands of the anisotropic metal nanoparticles or nanostructures to be appropriately overlapped with each other in spectra, it is possible to adjust the surface plasmon bands by controlling the aspect ratio of the anisotropic metal nanoparticles. That is, the surface plasmon bands of the anisotropic nanoparticles can be adjusted by controlling the aspect ratio. As the aspect ratio increases, the longitudinal plasmon resonance band is moved to a long wavelength, and a transverse surface plasmon resonance band is not largely changed compared to the longitudinal plasmon band. Accordingly, it is preferable to adjust the plasmon bands by controlling the aspect ratio, size and composition of the anisotropic metal nanoparticles depending on the spectrum of the light-emitting material and the light-emitting diode chip constituting the light conversion white light-emitting device. More specifically, it is possible to simultaneously exhibit the excitation enhancement and the emission enhancement of the light-emitting material by controlling two or more types of longitudinal and transverse surface plasmon resonance bands of the anisotropic metal nanoparticles over a range of near ultraviolet light, visible light and near infrared light to optimize overlapping with the light source of near ultraviolet light or blue light and the absorption wavelength and emission wavelength of the light-emitting material.

In the present invention, in order to allow the emission wavelength of the light source of the light-emitting device, the absorption and emission wavelengths of the light-emitting material and the surface plasmon bands of the anisotropic metal nanoparticles or nanostructures to be appropriately overlapped with each other in spectra, the nanoparticles manufactured in the core-shell form by using two or more kinds of metals may be used as the nanoparticles.

In the present invention, it is possible to provide the light conversion light-emitting device in which one surface plasmon band of the anisotropic metal nanoparticles or nanostructures is overlapped with the emission wavelength of the light source of the light-emitting device or the absorption wavelength of the light-emitting material, and the other surface plasmon band is overlapped with the emission wavelength of the light-emitting material. Since the transverse surface plasmon band of the core-shell nanorod is overlapped with the emission wavelength of the light-emitting diode chip, the light-emitting material can more effectively absorb excitation light of the light-emitting diode chip. As a result, it is possible to exhibit the excitation enhancement. In addition, since the emission wavelength of the light-emitting material is appropriately overlapped with the longitudinal surface plasmon band of the core-shell nanorod, it is possible to exhibit the emission enhancement causing an increase in internal quantum yield of the light-emitting material. Accordingly, it is possible to maximize the luminous intensity enhancement by simultaneously exhibiting the excitation enhancement and the emission enhancement of the light-emitting material.

In the present invention, when different types of light-emitting materials are introduced into an emissive layer, it is possible to provide the light conversion light-emitting device in which two or multiple surface plasmon resonance bands of the anisotropic metal nanoparticles or nanostructures are overlapped with the absorption and emission wavelengths of two or more types of light-emitting materials having different emission wavelengths.

In the present invention, when scattering efficiency and absorption efficiency are calculated from an extinction spectrum of the anisotropic metal nanoparticles or nanostructures, it is preferable to use nanoparticles having the scattering efficiency larger than the absorption efficiency. In this case, the size and aspect ratio of the anisotropic metal nanoparticles are determined in consideration of the scattering efficiency and the absorption efficiency constituting the extinction spectrum of the nanoparticles. This is because the scattering efficiency of the metal nanoparticles is generally related to the luminous intensity enhancement of the light-emitting material and is proportion to the sixth power ($r^6$) of the radius of spherical nanoparticles, whereas the absorption efficiency is related to quenching of the light-emitting material and is proportion to the third power ($r^3$) of the radius of the spherical nanoparticles. Accordingly, in order to exhibit the emission enhancement of the light-emitting material, it is desirable to use anisotropic nanoparticles having excellent scattering efficiency. To achieve this, the nanoparticles preferably have a size of 10 nm to 300 nm in a transverse direction and a size of 11 nm to 3000 nm in a longitudinal direction, and the aspect ratio is preferably 1.1 to 10.

INDUSTRIAL APPLICABILITY

According to the present invention, it is possible to provide the light conversion light-emitting device having a high luminance at low power and an enhanced light conversion efficiency by maximizing the luminous intensity enhancement by introducing the anisotropic metal nanoparticles and the light-emitting material into the emissive layer to simultaneously exhibit the excitation enhancement and the emission enhancement of the light-emitting material in the light conversion light-emitting device formed by a combination of the light-emitting diode having the emission wavelength in the near ultraviolet light range or the visible light range and the light-emitting material having the absorption and emission wavelengths in the visible light range.

That is, according to the present invention, since two or multiple surface plasmon bands of the anisotropic metal nanoparticles are effectively overlapped with the emission wavelength of the light-emitting device and the absorption and emission wavelengths of the light emitting material, it is possible to provide the light-emitting device capable of maximizing the luminous intensity enhancement by simultaneously exhibiting the emission enhancement causing an increase in internal quantum yield of the light-emitting material and the excitation enhancement due to an absorption increase of the light-emitting material.

According to the present invention, when light-emitting materials having different absorption and emission wavelengths are used to increase color gamut, it is possible to simultaneously exhibit the emission enhancements of the plurality of light-emitting materials by controlling two or multiple surface plasmon bands of the anisotropic metal nanoparticles to optimize overlapping with the absorption and emission wavelengths of the light-emitting materials, so that it is possible to provide the light conversion light-emitting device with enhanced color gamut and luminance.

Accordingly, the light conversion light-emitting device with enhanced luminescence efficiency by using the anisotropic metal nanoparticles or nanostructure according to the present invention can be used in various industry fields of signals, displays, communications, mobile terminals, vehicles, and general illuminations based on the existing light-emitting diode.

DETAILED EMBODIMENT OF THE INVENTION

Hereinafter, a light conversion white light-emitting device according to the present invention, which is formed by combining a light-emitting diode having an emission wavelength in a near ultraviolet light range or a visible light range and a light-emitting material having absorption and emission wavelengths in a visible light range, will be described in detail with reference to the accompanying drawings.

Figure 1:
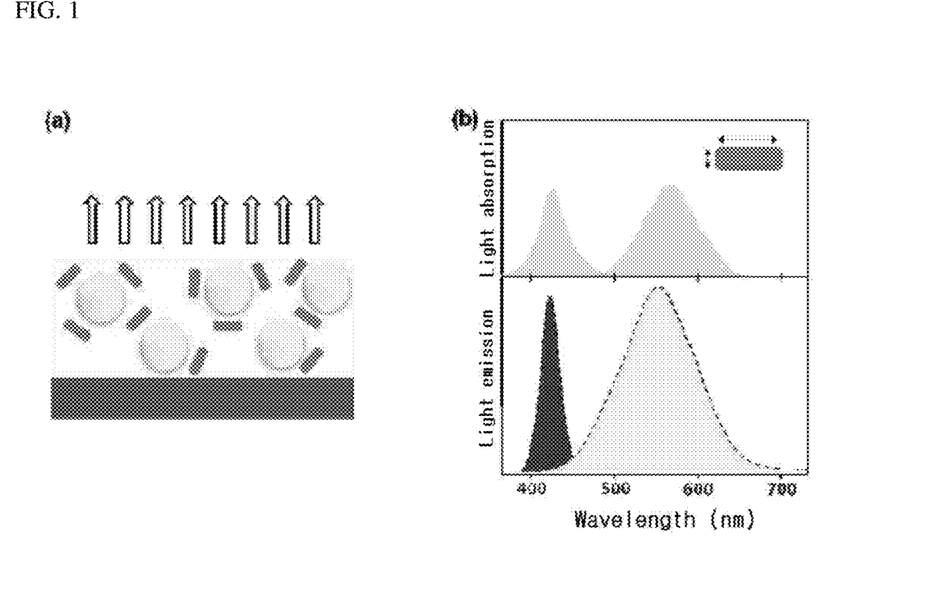
FIG. 1 illustrates schematic diagrams for describing a principle of a light conversion white light-emitting device with enhanced luminescence efficiency due to introduction of anisotropic metal nanoparticles.

FIG. 1 illustrates schematic diagrams for describing a concept of a light conversion white light-emitting device with enhanced luminescence efficiency due to anisotropic metal nanoparticles. FIG. 1(a) is a schematic diagram illustrating a configuration of the light conversion white light-emitting device which may include a substrate or a light-emitting diode chip, a light-emitting material, anisotropic metal nanoparticles, and a transparent polymer matrix. FIG. 1 (b) illustrates a spectrum overlap of the light-emitting diode chip, the light-emitting material and the anisotropic metal nanoparticles.

Figure 2:
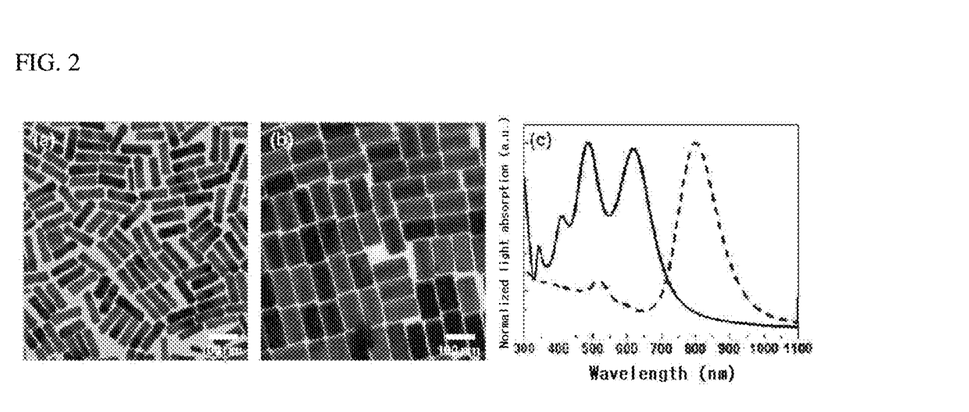
FIG. 2 illustrates transmission electron microscope (TEM) images of anisotropic metal nanoparticles and ultraviolet-visible absorption spectra (UV-Vis spectrum) representing corresponding surface plasmon bands.

FIG. 2 illustrates transmission electron microscope images of anisotropic nanoparticles having two or multiple surface plasmon bands in a near ultraviolet light range, a visible light range and a near infrared light range, and ultraviolet-visible light spectra thereof.

First, FIG. 2(a) is a transmission electron microscope images of a gold nanorod obtained by adding gold precursors to a gold seed as a base, growing the gold nanorod, and synthesizing the gold nanorod. FIG. 2(b) is a transmission electron microscope images of a gold-silver core-shell nanorod obtained by adding silver precursors to the gold nanorod as a seed and synthesizing the gold-silver nanorod. In FIG. 2(b), relatively darker black portions are gold cores, and portions surrounding the gold cores are silver shells. Further, FIG. 2(c) illustrates ultraviolet-visible absorption spectra of the gold nanorod (indicated by a dotted line) and the gold-silver core-shell nanorod (indicated by a solid line). From these spectra, it can be seen in the god nanorod that a transverse surface plasmon resonance band and a longitudinal surface plasmon resonance band are observed in a visible light range and a near infrared light range, respectively. And, it can be seen in the gold-silver core-shell nanorod that a transverse surface plasmon resonance band and a longitudinal surface plasmon resonance band are observed in a near ultraviolet light range and a visible light range, respectively. As described above, the surface plasmon bands of the anisotropic nanoparticles can be precisely adjusted to be formed in desired wavelength ranges. For example, for the gold-silver core-shell nanorod, by adjusting a relative ratio of the gold nanorod to the silver precursors, a thickness of the silver shell can be controlled. In this case, surface plasmon energy of the gold-silver core-shell nanorod can be precisely controlled over a range of near ultraviolet light to visible light depending on the thickness of the silver shell.

Figure 3:
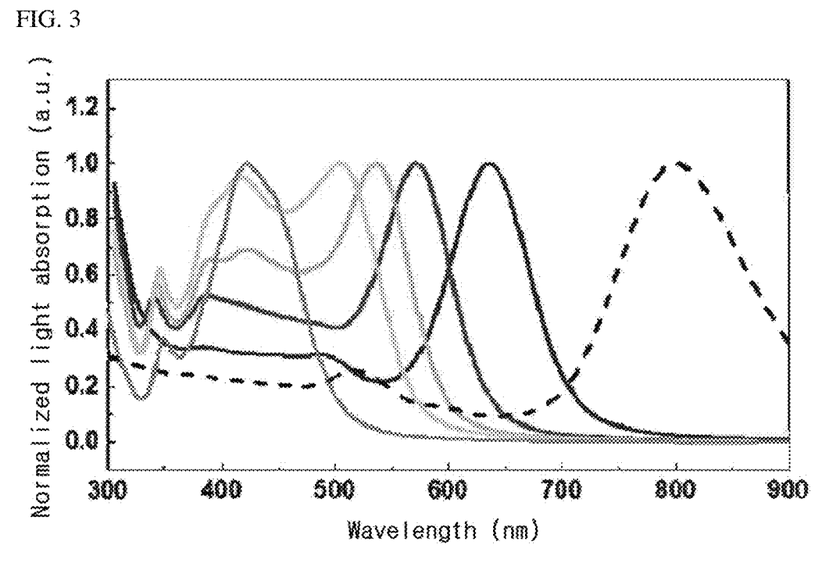
FIG. 3 illustrates ultraviolet-visible absorption spectra for describing precise control of surface plasmon bands in a near ultraviolet light range, a visible light range, and a near infrared light range depending on an aspect ratio and a metal composition ratio of a gold-silver core-shell nanorod.

FIG. 3 illustrates the ultraviolet-visible absorption spectra of the gold-silver core-shell nanorod, and it can be seen that the surface plasmon bands of the nanorod can be controlled by adjusting the relative ratio of the gold nanorod to the silver precursors. More specifically, a dotted line of FIG. 3 indicates the surface plasmon band of the gold nanorod used as the seed, and in this case, as the adding amount of silver precursors increases, the longitudinal surface plasmon band of the gold-silver core-shell nanorod is gradually moved to a short wavelength from a long wavelength. Accordingly, the surface plasmon band of the gold-silver core-shell nanorod can be formed in the visible light range, and can be precisely controlled. As described above, for the gold nanorod, the surface plasmon band can also be precisely controlled over the range of visible light to near infrared light by controlling the aspect ratio.

Figure 4:
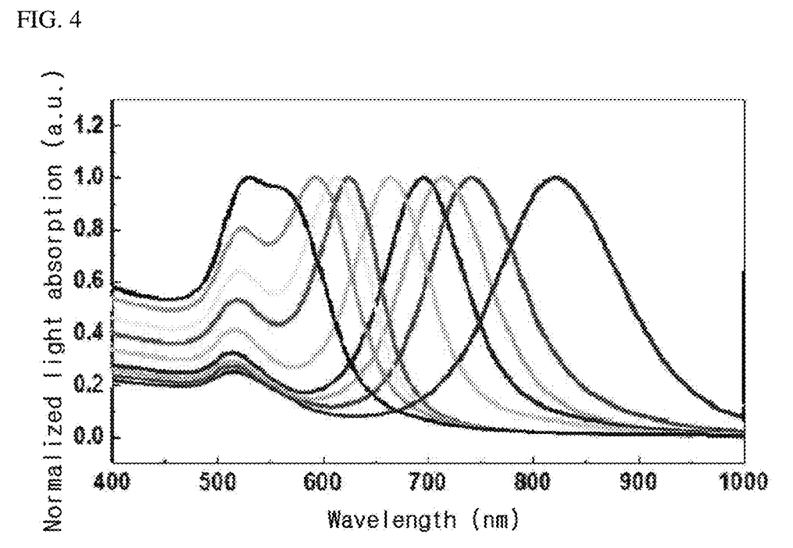
FIG. 4 illustrates ultraviolet-visible absorption spectra for describing precise control of surface plasmon bands in the visible light range and the near infrared light range due to control of aspect ratios of gold nanorods.
Figure 5:
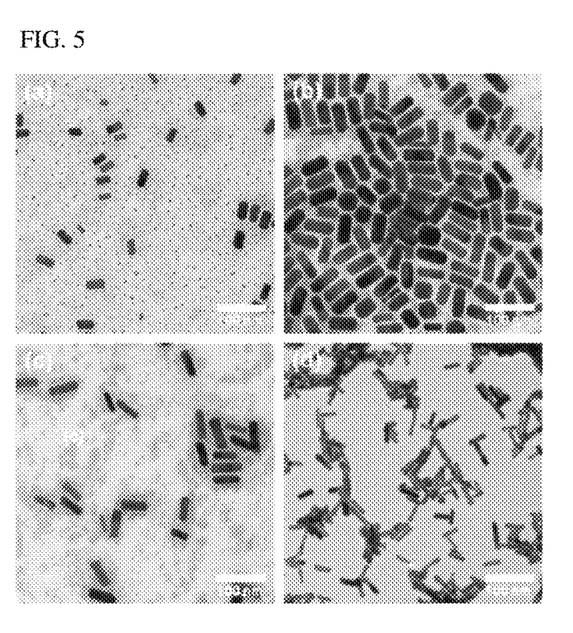
FIG. 5 shows transmission electron microscope images of the gold nanorods of controlled aspect ratios corresponding to the ultraviolet-visible absorption spectra of FIG. 4.

FIGS. 4 and 5 illustrate changes of surface plasmon bands due to aspect ratio adjustment of gold nanorods and transmission electron microscope images, respectively.

In an absorption spectrum of FIG. 4, as the aspect ratios decrease, surface plasmon bands formed in the near infrared light range of a long wavelength are moved to a short wavelength of the visible light range, and the transverse surface plasmon bands formed in the visible light range of the short wavelength are not largely changed.

FIG. 5 illustrates the transmission electron microscope images of the gold nanorods corresponding to those in FIG. 4. FIG. 5(a) illustrates a gold nanorod which has an average aspect ratio of 2 and a longitudinal surface plasmon band thereof is formed in a wavelength of 625 nm. FIG. 5(b) illustrates a gold nanorod which has an average aspect ratio of 2.6 and a longitudinal surface plasmon band thereof is formed in a wavelength of 664 nm. FIG. 5(c) illustrates a gold nanorod which has an average aspect ratio of 2.9 and a longitudinal surface plasmon band thereof is formed in a wavelength of 715 nm. FIG. 5(d) illustrates a gold nanorod which has an average aspect ratio of 4.5 and a longitudinal surface plasmon band thereof is formed in a wavelength of 820 nm.

In the light conversion white light-emitting device, a nitride semiconductor that emits near ultraviolet light or blue light may be used as the light-emitting diode, and various light-emitting devices that emit red light and green light may be used.

In the light conversion white light-emitting device, a light-emitting material including a semiconductor quantum dot may be used as the light-emitting material, regardless of the kind of the light-emitting material such as an organic material or an inorganic material. In order to emit white light with wide color gamut, a single light-emitting material or a plurality of light-emitting materials may be used.

In order to manufacture the light conversion white light-emitting device with enhanced luminescence efficiency using the anisotropic metal nanoparticles, the device may be manufactured by mixing the synthesized anisotropic nanoparticles and the light-emitting material with polymer having optical transparency such as polymethylmethacrylate (PMMA), silicone-based polymer, an epoxy-based polymer and the like to manufacture a film and then placing the manufactured film on a near ultraviolet or blue light-emitting diode chip or uniformly applying the mixed liquid on the light-emitting diode chip.

For example, the description will be presented in detail with reference to FIG. 1. As illustrated in the schematic diagram of FIG. 1(a), when white light is realized by a combination of a near ultraviolet light or blue light-emitting diode chip and a yellow light-emitting material, the gold-silver core-shell nanorod is located in an emissive layer by dispersing the gold-silver core-shell nanorod and the light-emitting material in the transparent polymer matrix described above. In this case, the anisotropic metal nanorod is not limited to the gold-silver core-shell nanorod, and metal nanoparticles and nanostructures that form two or multiple surface plasmon bands in the near ultraviolet light range and visible light range may be used as the anisotropic metal nanorod.

The surface plasmon bands of the gold-silver core-shell nanorod can be adjusted as illustrated in FIG. 2(c) and FIG. 3, in consideration of an emission wavelength of the light-emitting diode chip and absorption and emission wavelengths of the light-emitting material as illustrated in the schematic diagram illustrating the spectrum overlap of FIG. 1(b), and nanoparticles whose spectra are appropriately overlapped are selected to be introduced with the light-emitting material into the emissive layer. By doing this, the following effects are exhibited.

Since the transverse surface plasmon band of the gold-silver core-shell nanorod is overlapped with an emission wavelength of the light-emitting diode chip, the light-emitting material can more effectively absorb excitation light of the light-emitting diode chip, and excitation enhancement can be exhibited. In addition, since the emission wavelength of the light-emitting material is appropriately overlapped with the longitudinal surface plasmon band of the gold-silver core-shell nanorod, the emission enhancement causing an increase in internal quantum yield of the light-emitting material can be exhibited. Accordingly, the excitation enhancement and the emission enhancement of the light-emitting material are simultaneously exhibited, so that luminous intensity enhancement is maximized.

Figure 6:
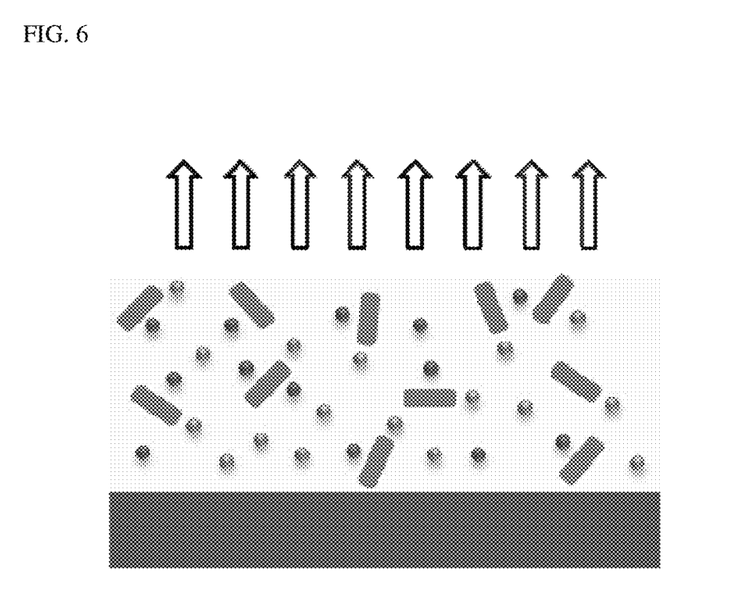
FIG. 6 is a schematic diagram of light conversion light-emitting device formed by introducing a plurality of light-emitting materials having different emission wavelengths and anisotropic metal nanoparticles into an emissive layer.

Meanwhile, in order to realize white light with wide color gamut, when light-emitting materials having different emission wavelengths are introduced into the emissive layer, the light conversion white light-emitting device can be manufactured as illustrated in FIG. 6, similarly to the method of manufacturing the light conversion light-emitting device described above.

Similarly to the case described above, by precisely adjusting the surface plasmon bands and optimizing the spectrum overlap as illustrated in FIG. 2(c) and FIGS. 3 and 4 in consideration of the absorption and emission spectra of the plurality of light-emitting materials, it is possible to induce the emission enhancement by the same principle as that in the case described above.

Especially, it is difficult for the green or red light-emitting material having a small stokes' shift which refers to a difference between a maximum absorption wavelength and a maximum emission wavelength of the light-emitting material to effectively absorb light of the near ultraviolet or blue light-emitting diode chip with a short wavelength. Thus, light conversion efficiency is very low. In this case, when the anisotropic metal nanoparticles that simultaneously have the surface plasmon bands in the near ultraviolet light range and the visible light range are used, both of the excitation enhancement and the emission enhancement can be exhibited.

What is claimed is:

1. A white light conversion light-emitting device comprising an emissive layer, wherein the emissive layer comprises a light-emitting material and anisotropic metal nanoparticles or nanostructures having an aspect ratio of 1.1 to 10 allowing two or multiple surface plasmon bands to be formed, wherein the anisotropic metal nanoparticles or nanostructures are core-shell nanoparticles made of two or more metals from Ag, Au, Al, Cu, Li, Pd, Pt, or an alloy thereof.

2. The white light conversion light-emitting device of claim 1, wherein one surface plasmon band of the anisotropic metal nanoparticles or nanostructures in the light conversion light-emitting device is overlapped with an emission wavelength of a light source of the light-emitting device or an absorption wavelength of the light-emitting material, and the other surface plasmon band thereof is overlapped with an emission wavelength of the light-emitting material.

3. The white light conversion light-emitting device of claim 1, wherein the emissive layer comprises a plurality of light-emitting material Is having different emission wavelength from one another introduced therein, and two or multiple surface plasmon resonance bands of the anisotropic metal nanoparticles or nanostructures are overlapped with absorption wavelengths and emission wavelengths of the plurality of light-emitting materials having different emission wavelength from one another.

4. The white light conversion light-emitting device of claim 1, wherein the anisotropic metal nanoparticles or nanostructures have scattering efficiency higher than absorption efficiency in a light absorption spectrum.

5. The white light conversion light-emitting device of claim 1, wherein the light-emitting material is an organic or inorganic material including a semiconductor quantum dot.

6. The white light conversion light-emitting device of claim 1, wherein the light conversion light-emitting device includes a combination of a light source with an emission wavelength of near ultraviolet light or blue light and a light-emitting material with an emission wavelength longer than that of the light source.

* * * * *